US008823538B2

(12) United States Patent
Liang et al.

(10) Patent No.: US 8,823,538 B2
(45) Date of Patent: Sep. 2, 2014

(54) ELECTRONIC DEVICE AND METHOD FOR OPTIMIZING ORDER OF TESTING POINTS OF CIRCUIT BOARDS

(75) Inventors: Hsien-Chuan Liang, New Taipei (TW); Shen-Chun Li, New Taipei (TW); Shou-Kuo Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 164 days.

(21) Appl. No.: 13/221,858

(22) Filed: Aug. 30, 2011

(65) Prior Publication Data

US 2012/0182154 A1    Jul. 19, 2012

(30) Foreign Application Priority Data

Jan. 17, 2011    (TW) .............................. 100101572 A

(51) Int. Cl.
*G08B 21/00* (2006.01)
*G01R 31/28* (2006.01)

(52) U.S. Cl.
CPC ................................. *G01R 31/2808* (2013.01)
USPC .................. 340/686.6; 324/537; 324/750.22; 324/755.01; 324/754.14

(58) Field of Classification Search
USPC .................. 324/537, 750.22, 754.14, 755.01
See application file for complete search history.

(56) References Cited

U.S. PATENT DOCUMENTS

| 5,631,856 A * | 5/1997 | Keller et al. ............. 324/750.22 |
| 2009/0015284 A1 * | 1/2009 | Blouin .......................... 324/761 |
| 2010/0295552 A1 * | 11/2010 | Li et al. ......................... 324/537 |
| 2011/0148448 A1 * | 6/2011 | St. Onge et al. ......... 324/755.01 |

FOREIGN PATENT DOCUMENTS

CN    101667219 A    3/2010

* cited by examiner

*Primary Examiner* — Daniel Wu
*Assistant Examiner* — Israel Daramola
(74) *Attorney, Agent, or Firm* — Novak Druce Connolly Bove + Quigg LLP

(57) ABSTRACT

In a method for optimizing an order in which certain points on a circuit board can be tested and evaluated, a coordinate system is established in a circuit diagram of a circuit board, and at least one locating point is preset. When an operator selects a signal path routing within the circuit diagram, the method can display the testing points in the selected signal path routing on a display device. After calculating the distance between each of the testing points and each of the at least one locating point, a group of distances is obtained. By comparing the distances, the minimum distance can be determined from the group of distances. The method further optimizes the order of the testing points according to the distance between each of the testing points and the locating point that consists of the minimum distance.

12 Claims, 3 Drawing Sheets

ELECTRONIC DEVICE AND METHOD FOR OPTIMIZING ORDER OF TESTING POINTS OF CIRCUIT BOARDS

BACKGROUND

1. Technical Field

Embodiments of the present disclosure generally relate to test management devices and methods, particularly to an electronic device and method for optimizing an order of testing points of a circuit board.

2. Description of Related Art

Electrical characteristic testing of signal path routings of a circuit board is an important phase in the manufacturing process, and is closely related to product quality. For further improvements in controlling a robot arm to measure the electrical characteristics of the testing points of the signal path routings, a prompt and accurate testing system is desirable.

DETAILED DESCRIPTION

In general, the term "module," as used herein, refers to logic embodied in hardware or firmware, or to a collection of software instructions, written in a programming language, such as, for example, Java, C, or assembly. One or more software instructions in the modules may be embedded in firmware, such as in an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of non-transitory computer-readable medium or other computer storage device.

Figure 1:
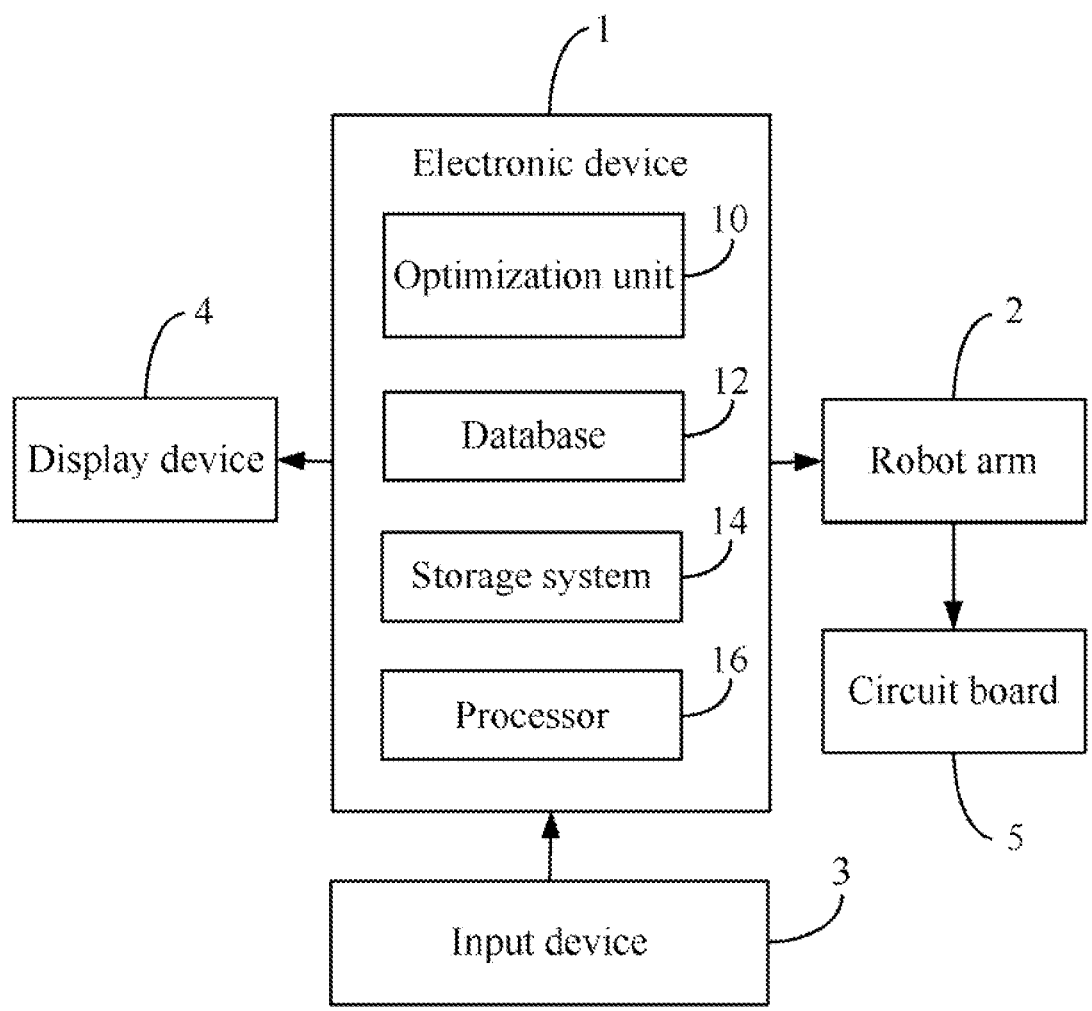
FIG. 1 is a block diagram of one embodiment of an electronic device including an optimization unit.

FIG. 1 is a block diagram of one embodiment of an electronic device 1 including an optimization unit 10. In the embodiment, functions of the unit 10 are implemented by the electronic device 1. The unit 10 can optimize an order of testing points for testing signal path routings of a circuit board 5, and control a robot arm 2 to measure electrical characteristics of each of the testing points, for enhancing the accuracy of measurements. Detailed functions of the unit 10 are described below with reference to FIG. 2. In one embodiment, the testing points include vias, pads, and pins in the circuit board 5.

In the embodiment, the electronic device 1 is electronically connected to an input device 3 and a display device 4. The input device 3 may be a keyboard, or a number of function buttons of the electronic device 1. During the process of optimizing an order in which certain points should be tested, the input device 3 is used for receiving user selections of a circuit name of a signal path routing from a circuit diagram of the circuit board 5. The display device 4 displays interfaces for the setting and resetting of parameters, the choice of circuit name, and the selection of a type of circuit test. In one embodiment, the circuit test type may include a coupon type and a trace type applied to the circuit board 5. A coupon is a miniature circuit of the circuit board 5, and a coupon type represents a circuit diagram of the miniature circuit of the circuit board 5. A trace is a printed or etched wire on the circuit board 5, and a trace type represents a circuit diagram of the circuit board 5.

In the embodiment, the electronic device 1 may be a computer, a server, a portable electronic device, or any other computing device that includes a database (e.g. a database 12), a storage system (e.g. a storage system 14) and at least one processor (e.g. a processor 16).

The database 12 stores a first file related to the coupon type of the circuit board 5, and a second file related to the trace type of the circuit board 5. The first and second files record circuit names of the signal path routings, names of testing points in each of the signal path routings, coordinates of the testing points, routing layer, trace length and trace width, and pins to be tested.

Figure 2:
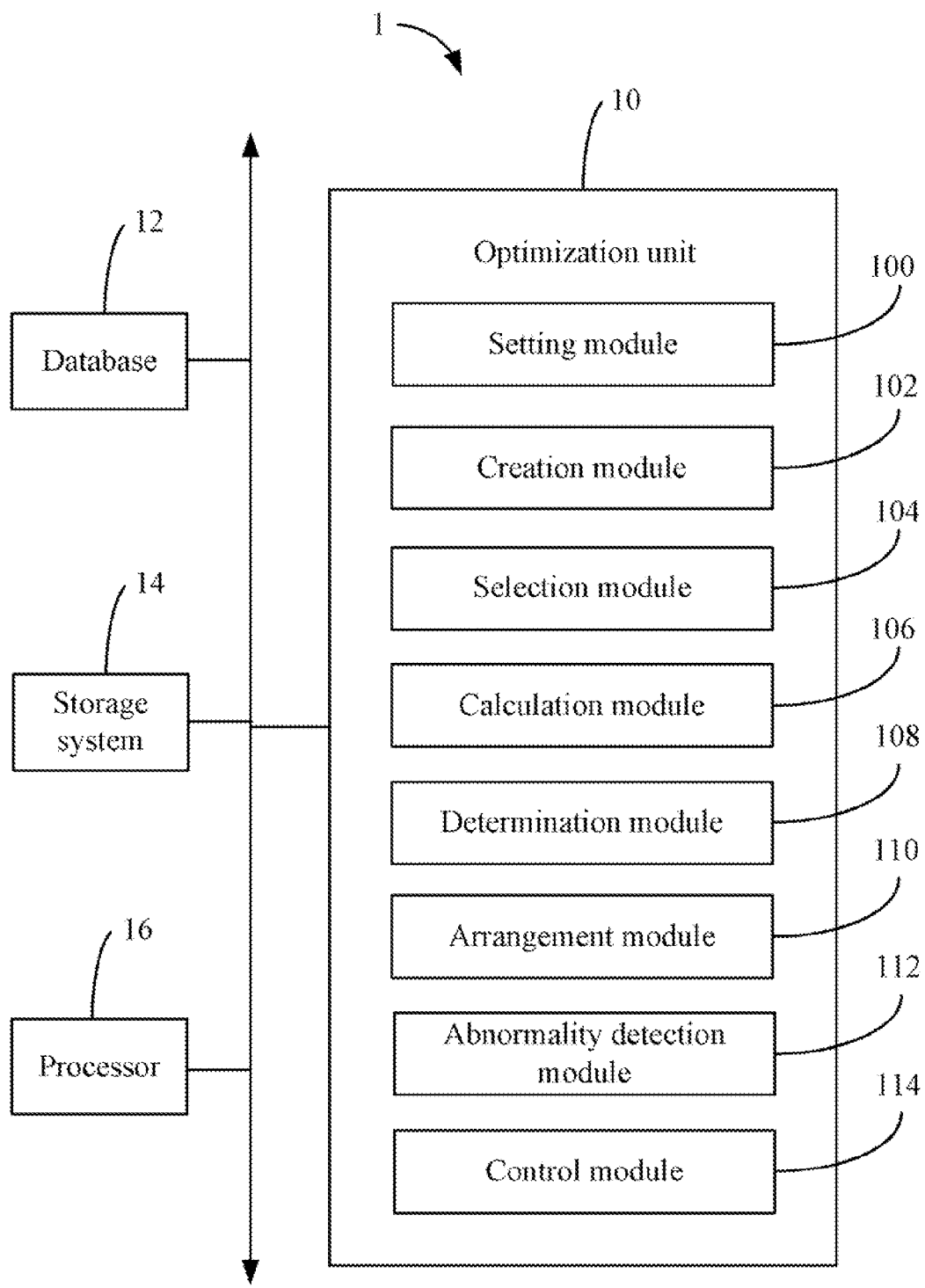
FIG. 2 is a block diagram of one embodiment of function modules of the optimization unit of FIG. 1.

FIG. 2 is a block diagram of one embodiment of function modules of the optimization unit 10 of FIG. 1. In one embodiment, the optimization unit 10 includes a setting module 100, a creation module 102, a selection module 104, a calculation module 106, a determination module 108, an arrangement module 110, an abnormality detection module 112, and a control module 114. Each of the modules 100-114 may be a software program including one or more computerized instructions that are stored in the storage system 14 and executed by the processor 16.

In one embodiment, the storage system 14 may be a magnetic or an optical storage system, such as a hard disk drive, an optical drive, a compact disc, a digital video disc, a tape drive, or other suitable storage medium.

The setting module 100 establishes a coordinate system for a circuit diagram of the circuit board 5, sets at least one locating point in the coordinate system and a maximum distance between the at least one locating point and the testing points of the circuit board 5. In the embodiment, the at least one locating point can be chosen from the coordinate system at random, the circuit diagram includes a plurality of signal path routings. Each of the at least one locating point may correspond to a circuit testing list for listing the testing list in an optimized order, and an abnormality list for listing abnormal testing points. The abnormal testing point can be described in paragraph [0022] as below.

According to the selection of the circuit test type by the user, the creation module 102 reads a corresponding file from the database 12, and imports the circuit names of all the signal path routings of the circuit board 5, the names of the testing points in each of the signal path routings, and the coordinates of the testing points from the corresponding file into a list.

In the embodiment, the circuit test type may include a coupon type and a trace type of the circuit board 5. The database 12 stores the first file related to the coupon type of circuit board 5, and the second file which is related to the trace type of the circuit board 5. For example, the first file may include a file named as "NetSinglePinNoPin.txt" and another file named as "EachLengthByLayer.htm," and the second file may include a file named as "EachLengthByPinPare.htm" and another file named as "EachLengthByNet.htm".

On the interface provided by the display device 4, the selection module 104 can select a signal path routing from the list by receiving the selection input by a user of a circuit name of the selected signal path routing, and display the testing points in the selected signal path routing on the display device 4.

The calculation module 106 calculates the distance between each of the testing points in the selected signal path routing and the at least one locating point, and obtains a group of distances incorporating all of the calculated distances. The determination module 108 finds a minimum distance from the group of distances. The arrangement module 110 sets the locating point which consists of the minimum distance as a base point.

For example, there are four testing points such as testing point a, testing point b, testing point c, and testing point d in the selected signal path routing. The locating point A is the nearest locating point to the testing point a, and the distance between the testing point a and the locating point A is say five centimeters. The locating point B is the nearest locating point to the testing point b, and the distance between the testing point b and the locating point B is say three centimeters. The locating point C is the nearest locating point to the testing point c, and the distance between the testing point c and the locating point C is say six centimeters. The locating point D is the nearest locating point to the testing point d, and the distance between the testing point d and the locating point B is say four centimeters. The determination module 108 determines that the distance between the testing point b and the locating point B is the minimum distance, i.e., three centimeters, and the arrangement module 110 sets the locating point B as the base point.

The arrangement module 110 optimizes the order of the testing points to be tested in the selected signal path routing according to the distance between each of the testing points and the base point. In the embodiment, the testing points can be arrayed in an ascending order (that is, the closest point is to be tested first) or a descending order, where the furthest point is to be tested first.

For example, if the locating point B is set as the base point, the distance between the testing point a and the base point is six centimeters, the distance between the testing point c and the base point is seven centimeters, and the distance between the testing point d and the base point is four centimeters, then the arrangement module 110 can optimize the order of the testing points a, b, c, and d as "b→d→a→c". In another embodiment, the arrangement module 110 may optimize the order of the testing points a, b, c, and d as "c→a→d→b".

The arrangement module 110 further saves the testing points in the circuit testing list of the base point (namely the circuit testing list of the locating point B) in an optimized order.

During the optimization of the testing points, the abnormality module 112 generates a warning to the operator if the distance between any testing point and the base point is greater than the maximum distance. The abnormality module 112 displays this information on the display device 4, and stores the coordinates of the testing point in the abnormality list of the base point, namely the abnormality list of the locating point B. In the embodiment, the testing points in the abnormality list can be named as the abnormal testing points.

In the embodiment, the calculation module 106 further computes the distance between each two testing points in the circuit testing list. The control module 114 controls the robot arm 2 to move to a first testing point of the circuit testing list, and measures the electrical characteristics of the first testing point. Then, the control module 114 finds a second testing point in the circuit testing list according to the first testing point, the optimized order, and the computed distance between the first testing point and the second testing point. The control module 114 controls the robot arm 2 to move to the next testing point to measure the electrical characteristics of the next testing point. In this way, the control module 114 can control the robot arm 2 to evaluate and measure all the testing points in the circuit testing list.

Figure 3:
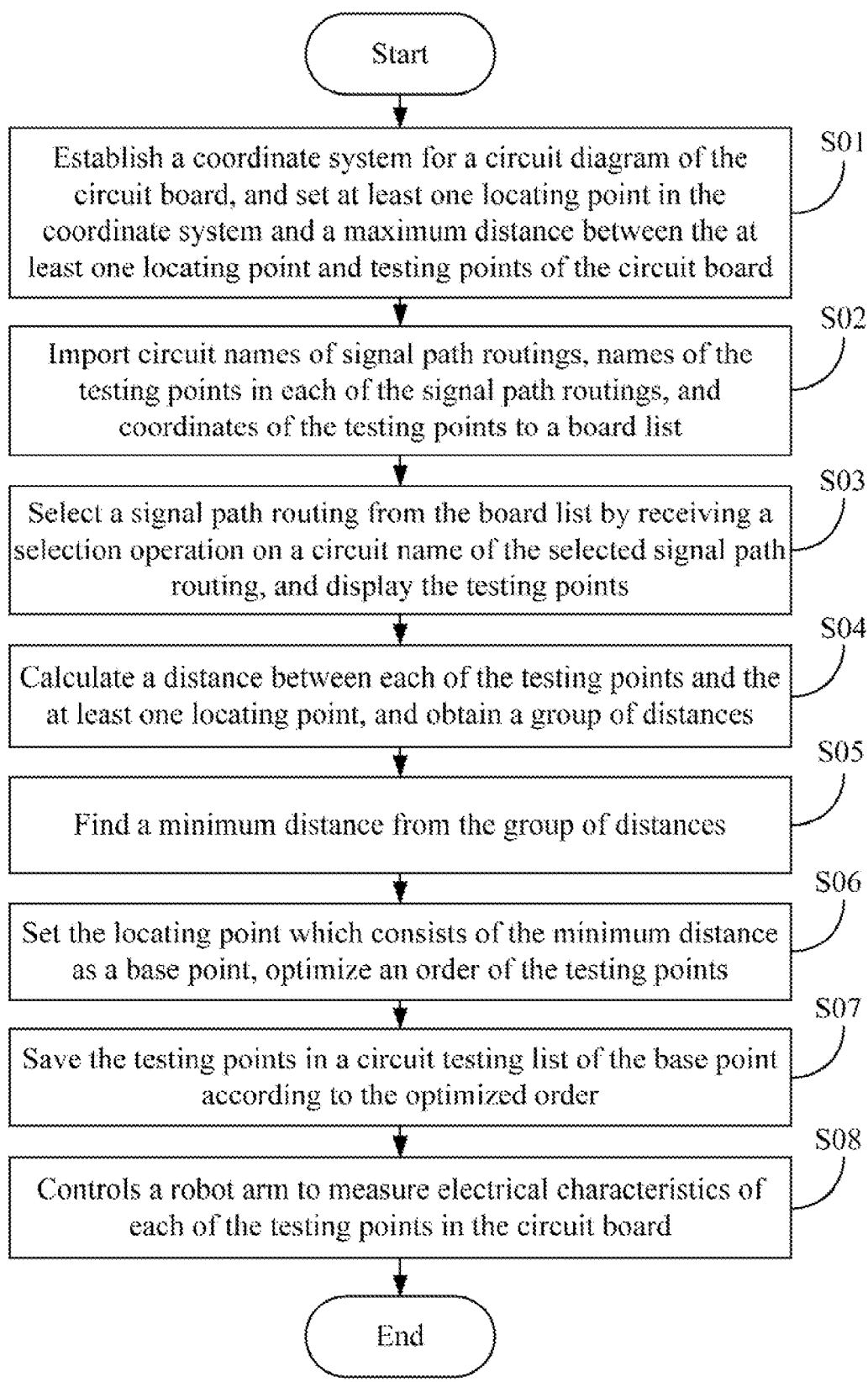
FIG. 3 is a flowchart illustrating one embodiment of a method for optimizing an order of testing points in relation to a circuit board.

FIG. 3 is a flowchart illustrating one embodiment of a method for optimizing the order in which certain points on a circuit board are tested and evaluated. Depending on the embodiment, additional blocks may be added, others removed, and the ordering of the blocks may be changed.

In block S01, the setting module 100 establishes a coordinate system for a circuit diagram of the circuit board 5, and sets at least one locating point in the coordinate system and the maximum distance between the at least one locating point and the testing points of the circuit board 5. In the embodiment, the circuit diagram includes a plurality of signal path routings. Each of the at least one locating point may correspond to a circuit testing list and an abnormality list.

In block S02, the creation module 102 reads a file related to a certain type of circuit test from the database 12 when the user inputs his selection of the type of circuit test he requires. The creation module 102 further imports the circuit names of the plurality of signal path routings, the names of the testing points in each of the signal path routings, and the coordinates of the testing points into a list. In the embodiment, the types of circuit test may include a coupon type and a trace type. The database 12 stores the first file related to the coupon type of circuit board 5, and the second file which is related to the trace type.

In block S03, the selection module 104 selects a signal path routing from the list by receiving a selection by the user of a circuit name of the selected signal path routing, and displays the testing points in the selected signal path routing on the display device 4.

In block S04, the calculation module 106 calculates the distance between each of the testing points in the selected signal path routing and the at least one locating point, and obtains a group of distances incorporating all of the calculated distances.

In block S05, the determination module 108 finds a minimum distance from the group of distance. For example, the determination module 108 finds that the distance between the testing point b and the locating point B is the minimum distance, as described in paragraph [0018] above.

In block S06, the arrangement module 110 sets the locating point which consists of the minimum distance as a base point (e.g., the locating point B), and optimizes an order of the testing points in the selected signal path routing according to the distance between each of the testing points and the base point. In the embodiment, the testing points can be arrayed in an ascending order or a descending order. For example, if the locating point B is set as the base point, and the distance between the testing point a and the base point is say six centimeters, the distance between the testing point c and the base point is say seven centimeters, and the distance between the test d and the base point is say four centimeters, the arrangement module 110 can optimize the order of the testing points a, b, c, and d as "b→d→a→c". In another exemplary embodiment, the arrangement module 110 can optimize the order of the testing points a, b, c, and d as "c→a→d→b".

In block S06, if the calculation module 106 calculates two distances which are the same, and both distances are the minimum distance, the determination module 108 sets the locating point which was used in the first calculation with the testing points as the base point. For example, if the distance between the locating point B and the testing point b is three centimeters, and the distance between the locating point D and the testing point b is also three centimeters, and three centimeters happens to be the minimum distance, the determination module 108 sets the locating point B as the base point.

In block S07, the arrangement module 110 saves the testing points in the circuit testing list of the base points (namely the circuit testing list of the locating point B) in an optimized order. If the distance between any testing point and the base point is greater than the preset maximum distance, the abnormality module 112 generates a warning to the operator by displaying the warning on the display device 4, and stores the coordinates of that testing point in the abnormality list of the base point, that is to say the abnormality list of the locating point B.

In block S08, the control module 114 controls the robot arm 2 to move to each of the testing points in accordance with the optimized order in the circuit testing list, and to evaluate and measure the electrical characteristics of each of the testing points in the circuit board 5.

All of the processes described above may be embodied in, and fully automated via, functional code modules executed by one or more general purpose processors of many electronic devices. The code modules may be stored in any type of non-transitory readable medium or other storage device. Some or all of the methods may alternatively be embodied in specialized hardware. Depending on the embodiment, the non-transitory readable medium may be a hard disk drive, a compact disc, a digital video disc, a tape drive or other suitable storage medium.

Although certain inventive embodiments of the present disclosure have been specifically described, the present disclosure is not to be construed as limited thereto. Various changes or modifications may be made to the present disclosure without departing from the scope and spirit of the present disclosure.

What is claimed is:

1. A computer-implemented method for optimizing an order of testing points of a circuit board using an electronic device, the method comprising:
    establishing a coordinate system for a circuit diagram of the circuit board, and setting at least one locating point in the coordinate system at random, the circuit diagram comprising a plurality of signal path routings;
    creating a list to save circuit names of the plurality of signal path routings, names of testing points in each of the signal path routings, and coordinates of the testing points;
    selecting a signal path routing from the list by receiving a selection input of a circuit name of the selected signal path routing, and displaying the testing points in the selected signal path routing on a display device that is electronically connected to the electronic device;
    calculating a distance between each of the testing points of the selected signal path routing and the at least one locating point, and obtaining a group of distances incorporating the calculated distances;
    determining a minimum distance from the group of distances, and setting the locating point that consists of the minimum distance as a base point;
    optimizing an order of the testing points to be tested in the selected signal path routing according to a distance between each of the testing points and the base point;
    upon the condition that the distance between any testing point and the base point is greater than a preset maximum distance, generating a warning to an operator, and displaying the warning on the display device; and
    storing the coordinates of the testing point in an abnormality list.

2. The method as described in claim 1, wherein the testing points are arrayed in an ascending order or a descending order of the distance between each of the testing points and the locating point that consists of the minimum distance.

3. The method as described in claim 1, further comprising:
    (a) controlling a robot arm to move to a first testing point of the selected signal path routing, and measuring electrical characteristics of the first testing point;
    (b) finding a next testing point of the selected signal path routing according to the first testing point, the order, and a distance between the first testing point and the next testing point;
    (c) controlling the robot arm to move to the next testing point, and measuring the electrical characteristics of the next testing point; and
    (d) repeating block (b) and block (c) till all the testing points in the selected signal path routing is measured.

4. The method as described in claim 1, wherein the testing points include vias, pads, and pins in the circuit board.

5. An electronic device, comprising:
    at least one processor;
    a storage system; and
    one or more modules that are stored in the storage system and executed by the at least one processor, the one or more modules comprising:
    a setting module operable to establish a coordinate system for a circuit diagram of the circuit board, and set at least one locating point in the coordinate system at random, the circuit diagram comprising a plurality of signal path routings;
    a creation module operable to create a list to save circuit names of the plurality of signal path routings, names of testing points in each of the signal path routings, and coordinates of the testing points;
    a selection module operable to select a signal path routing from the list by receiving a selection input of a circuit name of the selected signal path routing, and display the testing points in the selected signal path routing on a display device that is electronically connected to the electronic device;
    a calculation module operable to calculate a distance between each of the testing points of the selected signal path routing and the at least one locating point, and obtain a group of distances incorporating the calculated distances;
    a determination module operable to determine a minimum distance from the group of distances, and set the locating point that consists of the minimum distance as a base point;
    an arrangement module operable to set the locating point which consists of the minimum distance as a base point, and optimize an order of the testing points to be tested in the selected signal path routing according to a distance between each of the testing points and the base point; and
    an abnormality detection module operable to generate a warning to an operator and display the warning on the display device, upon the condition that the distance between any testing point and the base point is greater than a preset maximum distance, and store the coordinates of the testing point in an abnormality list.

6. The electronic device as described in claim 5, wherein the testing points are arrayed in an ascending order or a descending order of the distance between each of the testing points and the locating point that consists of the minimum distance.

7. The electronic device as described in claim 5, further comprising a control module operable to control a robot arm to move to measure electrical characteristics of the testing point in the selected signal path routing according to the optimized order of the testing points.

8. The electronic device as described in claim 5, wherein the testing points include vias, pads, and pins in the circuit board.

9. A non-transitory storage medium having stored thereon instructions that, when executed by a processor of an electronic device, causes the processor to perform a method for optimizing an order of testing points of a circuit board, the method comprising:

establishing a coordinate system for a circuit diagram of the circuit board, and setting at least one locating point in the coordinate system at random, the circuit diagram comprising a plurality of signal path routings;

creating a list to save circuit names of the plurality of signal path routings, names of testing points in each of the signal path routings, and coordinates of the testing points;

selecting a signal path routing from the list by receiving a selection input of a circuit name of the selected signal path routing, and displaying the testing points in the selected signal path routing on a display device that is electronically connected to the electronic device;

calculating a distance between each of the testing points of the selected signal path routing and the at least one locating point, and obtaining a group of distances incorporating the calculated distances;

determining a minimum distance from the group of distances, and setting the locating point that consists of the minimum distance as a base point;

optimizing an order of the testing points to be tested in the selected signal path routing according to a distance between each of the testing points and the base point; and upon the condition that the distance between any testing point and the base point is greater than a preset maximum distance, generating a warning to an operator, and displaying the warning on the display device; and storing the coordinates of the testing point in an abnormality list.

10. The storage medium as described in claim 9, wherein the testing points are arrayed in an ascending order or a descending order of the distance between each of the testing points and the locating point that consists of the minimum distance.

11. The storage medium as described in claim 9, wherein the method further comprises:

(a) controlling a robot arm to move to a first testing point of the selected signal path routing, and measuring electrical characteristics of the first testing point;

(b) finding a next testing point of the selected signal path routing according to the first testing point, the order, and a distance between the first testing point and the next testing point;

(c) controlling the robot arm to move to the next testing point, and measuring the electrical characteristics of the next testing point; and (d) repeating block (b) and block (c) till all the testing points in the selected signal path routing is measured.

12. The storage medium as described in claim 9, wherein the testing points include vias, pads, and pins in the circuit board.

* * * * *